US008494105B1

(12) United States Patent
Patterson

(10) Patent No.: US 8,494,105 B1
(45) Date of Patent: Jul. 23, 2013

(54) APPARATUS AND METHOD FOR PROVIDING DIGITAL REPRESENTATION OF TIME DIFFERENCE BETWEEN CLOCKS

(75) Inventor: Jeffery Patterson, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 289 days.

(21) Appl. No.: 12/951,251

(22) Filed: Nov. 22, 2010

(51) Int. Cl.
*H03D 3/24* (2006.01)

(52) U.S. Cl.
USPC ........... 375/376; 375/294; 375/327; 375/360; 375/373

(58) Field of Classification Search
USPC .......................... 375/376, 294, 327, 360, 373
See application file for complete search history.

(56) References Cited

U.S. PATENT DOCUMENTS

| | | | | |
|---|---|---|---|---|
| 5,821,816 | A | * | 10/1998 | Patterson ...................... 331/1 A |
| 2002/0075976 | A1 | * | 6/2002 | Richards et al. .............. 375/354 |
| 2005/0104638 | A1 | * | 5/2005 | Saeki ............................ 327/157 |
| 2007/0021933 | A1 | * | 1/2007 | Sanduleanu et al. ............ 702/72 |
| 2009/0153377 | A1 | | 6/2009 | Chang |

OTHER PUBLICATIONS

Chun-Ming Hsu et al., "A Low-Noise Wide-BW 3.6-GHz Digital Fractional-N Frequency Synthesizer With a Noise-Shaping Time-to-Digital Converter and Quantization Noise Cancellation", IEEE Journal of Solid-State Circuits,vol. 43, No. 12, Dec. 2008, pp. 2776-2786.
V. Kratyuk et al., "A Digital PLL with a Stochastic Time-to-Digital Converter", 2006 Symposium on VLSI Circuits Digest of Technical Papers, Publication Year: 2006, pp. 31-32.
I. Nissinen et al., "A CMOS time-to-digital converter based on a ring oscillator for a laser radar", Proceedings of the 29th European Solid-State Circuits Conference, Publication Year: 2003 , pp. 469-472.
E. Raisanen-Ruotsalainen et al., "A BiCMOS time-to-digital converter with 30 PS resolution", Proceedings of the 1999 IEEE International Symposium on Circuits and Systems, vol. 1, Publication Year: 1999 , pp. 278-281.
B.M. Helal, "A Highly Digital MDLL-Based Clock Multiplier That Leverages a Self-Scrambling Time-to-Digital Converter to Achieve Subpicosecond Jitter Performance", IEEE Journal of Solid-State Circuits, vol. 43, No. 4 Apr. 2008, pp. 855-863.

* cited by examiner

*Primary Examiner* — Kabir A Timory

(57) ABSTRACT

An apparatus provides a digital representation of a time difference between a periodic reference signal having a reference signal period and a periodic input signal having an input signal period. The apparatus includes a free-running finite state machine (FSM) that traverses a multiplicity of states in a predetermined order, the state having corresponding state vectors, each of which is held for a state dwell time. A timing circuit receives the reference signal, the input signal and the FSM state vectors, and determines a state transition count equal to a number of FSM state transitions that occur during a counting interval, which corresponds to the time difference between the reference and input signals. A digital low-pass filter receives the state transition counts and provides an output value including weighted sums of the state transition counts, proportional to the time difference between the reference and input signal. A period of the FSM is independent of the reference signal period.

20 Claims, 14 Drawing Sheets

APPARATUS AND METHOD FOR PROVIDING DIGITAL REPRESENTATION OF TIME DIFFERENCE BETWEEN CLOCKS

BACKGROUND

Time-to-digital converters (TDCs) have been developed for various transducer applications, such as laser range finding, and for open-loop time-domain applications, such as Global Positioning System (GPS) decoders. Known TDCs generally cannot operate at comparatively high clock rates or meet the noise performance required for low phase-noise synthesis applications. These known TDCs generally rely on gate delay as the basic unit of time measurement, which limits the time resolution and thus the quantization noise floor. In addition, meta-stability issues associated with asynchronous timing presents design challenges. Therefore, implementation of high performance all-digital phase-lock loops (ADPLLs), for example, relying on TDCs has been hampered because known TDCs have substantially worse noise performance than phase detectors used in analog PLLs.

SUMMARY

In a representative embodiment, an apparatus provides a digital representation of a time difference between a periodic reference signal and a periodic input signal, the reference signal having a reference signal period and the input signal having an input signal period. The apparatus includes a free-running finite state machine (FSM), a timing circuit, and a digital low-pass filter. The FSM is configured to traverse a multiplicity of states in a predetermined order, the states having corresponding state vectors, each of which is held for a state dwell time. The timing circuit is configured to receive the reference signal, the input signal and the FSM state vectors, and to determine at each reference signal period of the reference signal a state transition count equal to a number of FSM state transitions that occur during a counting interval, where the counting interval corresponds to the time difference between the reference signal and the input signal. The digital low-pass filter is configured to receive the state transition counts corresponding to the reference signal periods, and to provide a digital output value comprising weighted sums of the state transition counts, the digital output value being proportional to the time difference between the reference signal and the input signal. A period of the FSM is independent of the reference signal period.

In a representative embodiment, a method is provided for determining a digital representation of a time difference between a periodic reference signal and a periodic input signal. The method includes receiving the reference signal and the input signal, where the reference signal has a corresponding reference signal period and the input signal has a corresponding input signal period; receiving state vectors corresponding to a multiplicity of states periodically traversed by a continuously free-running FSM in a predetermined order, each state vector being held for a state dwell time occurring between state transitions; and determining transition counts corresponding to counting intervals, the state transition counts being numbers of state transitions occurring in the FSM during the corresponding counting intervals. Each counting interval indicates the time difference between the reference signal and the input signal for each corresponding reference signal period. Weighted sums of the numbers of the FSM state transitions are produced, each weighted sum being indicative of a ratio between the corresponding counting interval and the state dwell time. An output signal is output, the output signal estimating the time difference between the periodic reference signal and the input signal based on the ratio between the corresponding counting interval and the state dwell time. A period of the FSM is independent of the reference signal period.

In a representative embodiment, an all digital phase lock loop (ADPLL) includes a time-to-digital converter (TDC) configured to provide a digital time difference signal representing a time difference between a reference signal and an input signal based on an analog output signal of the ADPLL, the reference signal having a reference signal period and the input signal having an input signal period equal to the reference signal period; and a controllable oscillator configured to provide the analog output signal, the analog output signal having a frequency controlled by the digital time difference signal. The TDC includes a free-running finite FSM, a timing circuit, and a digital low-pass filter. The FSM is configured to traverse multiple states in a predetermined order, the states having corresponding state vectors, each of which is held for a state dwell time. The timing circuit is configured to receive the reference signal, the input signal and the state vectors, and to determine state transition counts equal to a number of FSM state transitions that occur during a counting interval at each reference signal period, where the counting interval corresponds to the time difference between the reference signal and the input signal. The digital low-pass filter is configured to receive the state transition counts corresponding to the reference signal periods, and to provide an output value including weighted sums of the state transition counts, the output value being proportional to the time difference between the reference signal and the input signal, where a period of the FSM is independent of the reference signal period.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
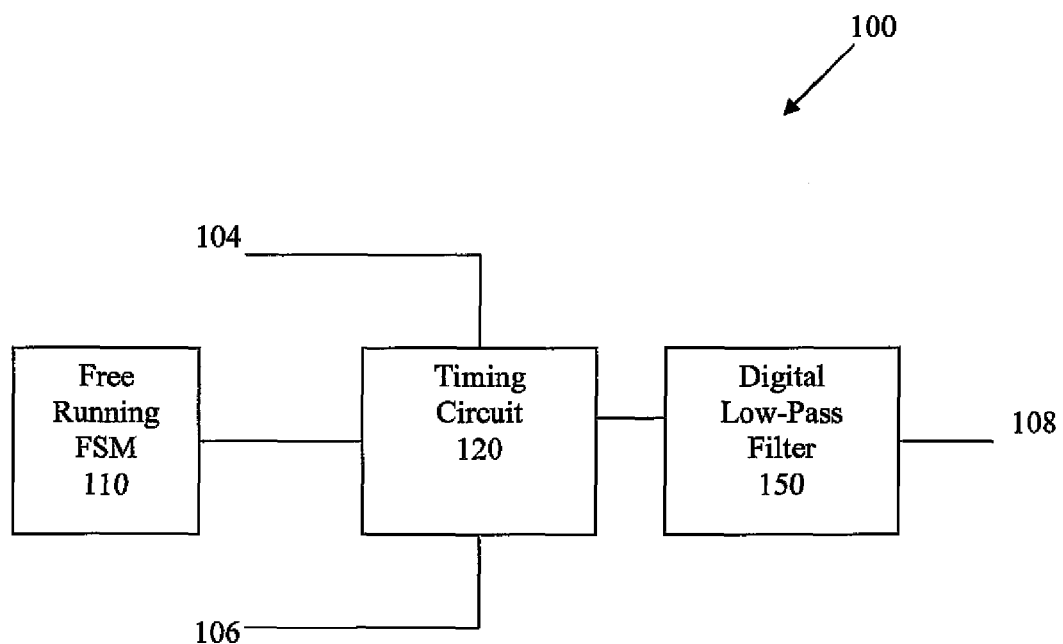
FIG. 1 is a block diagram illustrating a time-to-digital conversion system, according to a representative embodiment.

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

Generally, various representative embodiments use stochastic means to improve timing resolution and noise performance of a system for performing time-to-digital conversion, while still using a gate delay as the basic unit of time measurement. Multiple electric gates of equal nominal delay are connected into a free running finite state machine (FSM). The number of state transitions during a counting interval is measured between corresponding points on a reference signal and an input signal, where the counting interval corresponds to a timing difference between the reference and input signals. Stochastic methods are used to improve timing resolution. This avoids problems associated with meta-stability experienced by conventional TDCs, and in fact exploits meta-stability to provide self-dither.

FIG. 1 is a block diagram showing an illustrative system for performing time-to-digital conversion to provide a digital representation of a time difference between a reference signal and an input signal, according to a representative embodiment.

Referring to FIG. 1, time-to-digital conversion system 100 includes free-running finite state machine (FSM) 110, timing circuit 120 and digital low-pass filter 150. The FSM 110 continuously traverses a multiplicity of states in a predetermined order. Each state has a corresponding state vector that held for an essentially constant state dwell time ($\tau_d$). When the FSM 110 traverses from one state to the next, it is referred to as a state transition.

During one FSM period, the FSM 110 passes through a predetermined number of state transitions, and then repeats the state transitions in each subsequent FSM period. That is, the FSM 110 creates a sequence of states that it traverses in a predetermined FSM period $T_{FSM}$, and then repeats in each subsequent FSM period $T_{FSM}$, thus providing a continuous periodic, repetitive sequence of states. The states are evenly distributed across the FSM period $T_{FSM}$.

Figure 2A:
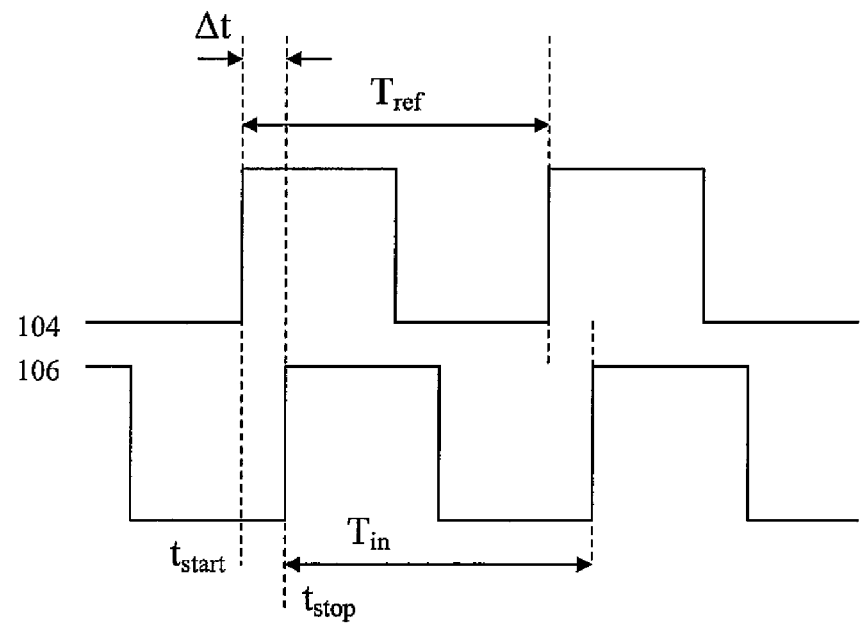
FIG. 2A is a timing chart showing a time difference between a reference signal and an input signal.

The timing circuit 120 receives reference signal 104, which may be a reference clock, and input signal 106, which may be an input clock, for example. The reference signal 104 has a reference signal period corresponding to the inverse of reference signal frequency $f_{ref}$. The input signal has an input signal period that, on average, is the same as the reference signal period. However, the input signal period and the reference signal period may not be aligned, as shown in FIG. 2A. The FSM period of the FSM 110 is independent of the reference signal period and the input signal period.

The timing circuit 120 also receives FSM state vectors, and determines at each reference signal period of the reference signal 104 a state transition count equal to the number of FSM state transitions that occur during a counting interval. The counting interval corresponds to the time difference ($\Delta t$) between the reference signal 104 and the input signal 106. For purpose of discussion, this time difference is defined by a start time corresponding to a predetermined level of the reference signal 104 and a stop time corresponding to a predetermined level of the input signal 106. Alternatively, the start time may correspond to a rising (or falling) edge of the reference signal 104, and the stop time may correspond to a rising (or falling) edge of the input signal 106.

The digital low-pass filter 150 receives the state transition counts corresponding to the reference signal periods from the timing circuit 120. The digital low-pass filter 150 provides a digital output signal 108 that includes weighted sums of the state transition counts. The digital output signal 108 is therefore proportional to the time difference between the reference signal 104 and the input signal 106.

For example, the digital low-pass filter 150 may receive the state transition counts from the timing circuit 120 and apply filter weighting coefficients in order to output corresponding weighted sums of the state transition counts that are convergent to the time difference between the reference signal 104 and the input signal 106. When the weighting coefficients are unity, the weighted sums provide the average of the state transition counts. The rate of the digital output signal 108 of the digital low-pass filter 150 is equal to that of the reference signal 104.

In various embodiments, the digital low-pass filter 150 may be implemented as any type of digital filter, such as a finite impulse response (FIR) filter, a polyphase filter, or the like. Also, as discussed below, the digital low-pass filter 150 may included in a decimator circuit, in which case the digital low-pass filter 150 is followed (or preceded) by a down sampler to provide the digital output signal 108 at a lower rate and higher time resolution, without departing from the scope of the present teachings.

FIG. 2A is a timing chart showing a representative counting interval, indicated by time difference $\Delta t$, between the reference signal 104 and the input signal 106. Reference signal period $T_{ref}$ is indicated by two adjacent rising edges of the reference signal 104, encompassing one reference signal cycle, although the reference signal period $T_{ref}$ may likewise be indicated by two adjacent falling edges or two predetermined levels of equal value. Likewise, input signal period $T_{in}$ is indicated by two adjacent rising edges of the input signal 106, encompassing one input signal cycle, although the input signal period $T_{in}$ may likewise be indicated by two adjacent falling edges or two predetermined levels of equal value.

Input signal period $T_{in}$ is equal to the reference signal period $T_{ref}$, but the input signal 106 is shown lagging the reference signal 104 by the time difference $\Delta t$. The time difference $\Delta t$ is measured from the start time $t_{start}$ at the beginning of the reference signal period to the stop time $t_{stop}$ at the beginning of the corresponding input clock period. In various embodiments, the time difference $\Delta t$ may be measured at the end of the reference and input signal periods, may be measured between falling edges as opposed to rising edges, or may be measured from any two corresponding points (e.g., defined by levels) on the reference signal 104 and input signal 106 respectively, without departing from the scope of the present teachings. As discussed below, the time-to-digital conversion system 100 is configured to detect the time difference $\Delta t$, e.g., so that the time difference $\Delta t$ may be reduced or eliminated through a feedback loop.

Figure 2B:
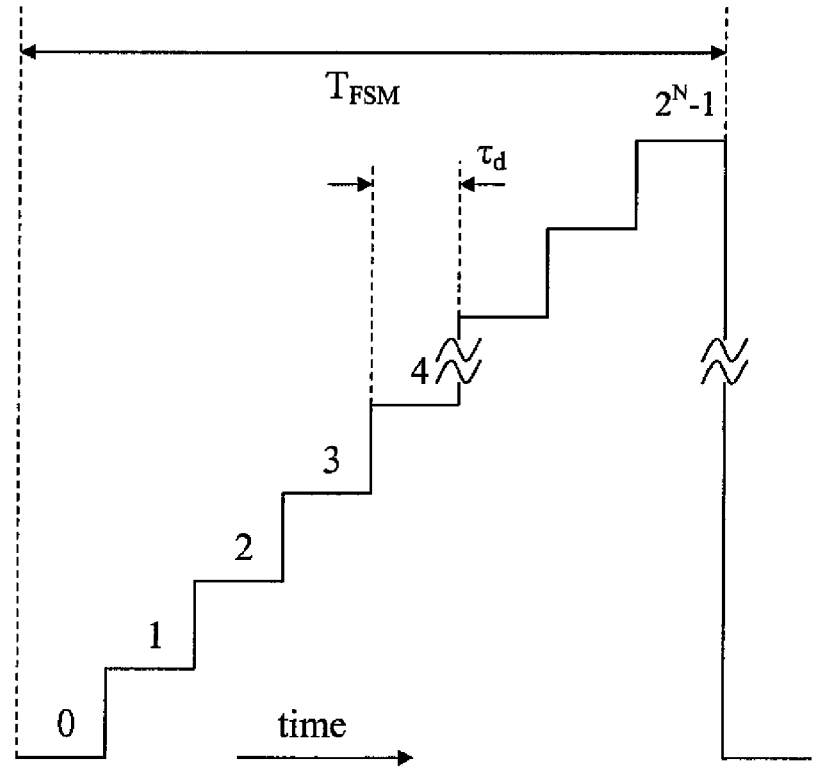
FIG. 2B is a timing chart showing state dwell times corresponding to state transitions of a free-running finite state machine, according to a representative embodiment.

FIG. 2B is a timing chart showing illustrative state dwell times $\tau_d$ corresponding to state transitions of the FSM 110, according to a representative embodiment. Referring to FIG. 2B, one FSM period $T_{FSM}$ is shown, which includes state vector values (0, 1, 2, 3, 4, . . . $2^N-1$), where N refers to the number of bits contained in each state vector. Each state vector value corresponds to one of the periodically traversed states and is held for the state dwell time $\tau_d$. In the depicted example, the state vector values increase incrementally in a stair step fashion through each state transition from 0 to $2^N-1$, at which point the sequence of the state vector values is repeated, beginning with 0. The numbering system used to assign a state vector value to a particular FSM state is arbitrary as long as the state values are able to be decoded into an unambiguous representation of the state. Other numbering systems and associated decoding methods may be used without departing from the scope of the present teachings.

The FSM 110 is referred to as "free running" because the FSM period $T_{FSM}$, as well as the state dwell time $\tau_d$, is independent from the reference signal period and the input signal period. In addition, the FSM 110 periodically and continuously traverses a multiplicity of states in a predetermined order, as discussed above. "Continuously" means that the FSM 110 is not gated by a reference or input signal, and is uninterrupted. In general, the FSM period $T_{FSM}$ is smaller than the reference signal period $T_{ref}$ to ensure statistical independence of the state vector value samples as discussed below. For example, in an illustrative implementation, the FSM period $T_{FSM}$ may correspond to a frequency of about 5 GHz to about 20 GHz, and the reference signal period $T_{ref}$ may correspond to a frequency of about 100 MHz to about 200 MHz. Because the FSM period is independent of the reference signal period and substantially shorter, an indeterminate number of FSM periods and fraction thereof will occur between subsequent counting intervals, and the FSM state vector values sampled at each start time $t_{start}$ will be statistically independent from each other and distributed uniformly across the available states in random fashion. Likewise, the position in time of the start time $t_{start}$ relative to the position of the immediately preceding FSM state transition will also be random and uniformly distributed across an interval equal to the state dwell time $\tau_d$. It is this characteristic that makes the number of FSM state transitions which occur during the counting interval a bimodally distributed random value that can be operated upon stochastically to extract a central value proportional to the time difference $\Delta t$ with a resolution finer than the gate delay time (i.e., the state dwell time $\tau_d$), as discussed below.

Figure 3:
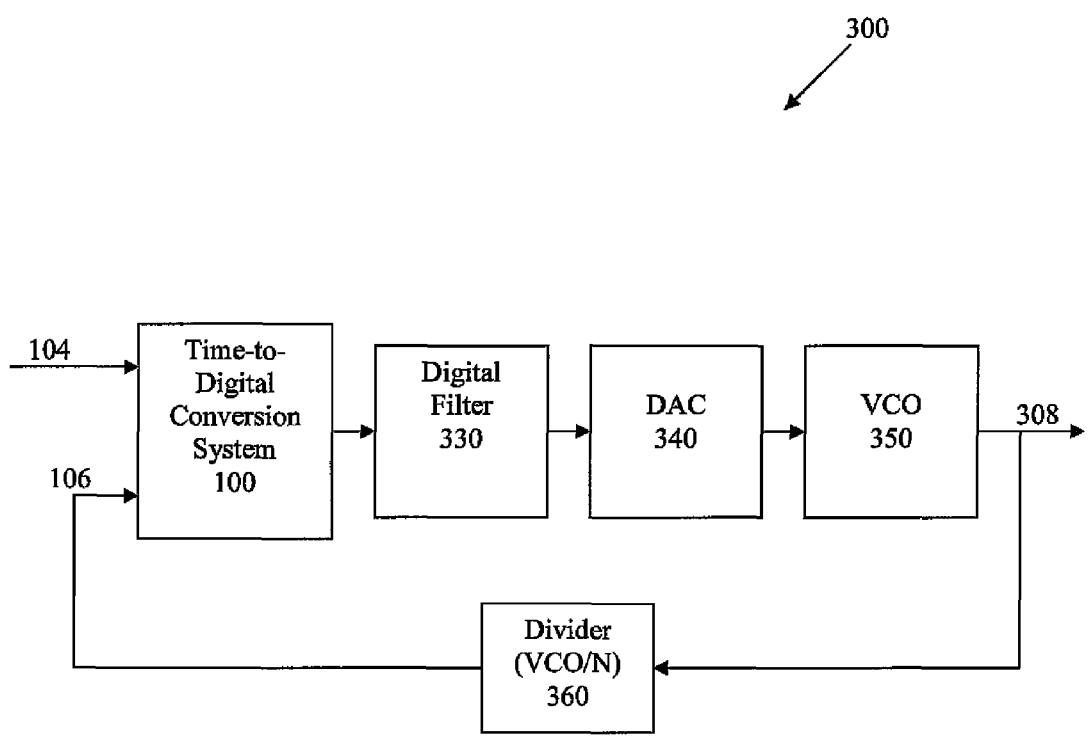
FIG. 3 is a block diagram illustrating an ADPLL, including a time-to-digital conversion system, according to a representative embodiment.

FIG. 3 is a block diagram illustrating an ADPLL, including a time-to-digital conversion system, according to a representative embodiment. Referring to FIG. 3, ADPLL 300 includes a time-to-digital conversion system 100, a digital filter 330, a controllable oscillator, e.g., implemented by representative digital-to-analog converter (DAC) 340 and voltage controlled oscillator (VCO) 350, and a divider 360.

The time-to-digital conversion system 100 receives a reference signal and an input signal, and outputs an average state transition count proportional to the time difference, as discussed above. The state transition counts are filtered by digital filter 330, which may be a low-pass filter, for example, and may include such compensation as required for stability of the feedback loop. The filter output signal is converted to an analog output signal by the DAC 340, and input to the VCO 350, which adjusts the frequency of output signal 308 based on the analog output signal. The adjusted analog output signal 308 is provided by the VCO 350 to the divider 360, which divides the frequency of the adjusted output signal 308 by N. The divider 360 may also be a so called fractional N divider. The divided signal is fed back to be input to the time-to-digital conversion system 100 as the input signal 106. Accordingly, the time difference $\Delta t$ is reduced to zero over time. Of course, in alternative embodiments, the controllable oscillator may be implemented as a digitally controlled oscillator (DCO) (not shown) in place of the DAC 340 and the VCO 350, without departing for the scope of the present teachings.

To explain operation of the time-to-digital conversion system 100, the counting interval or time difference $\Delta t$ may be expressed in terms of the gate delay parameter or state dwell time $\tau_d$ of the FSM 110, indicated by Equations (1A) and (1B), as follows:

$$\Delta t = \left[\left\lfloor \frac{\Delta t}{\tau_d} \right\rfloor + \frac{\Delta t \bmod \tau_d}{\tau_d}\right] \cdot \tau_d \quad (1A)$$

$$\Delta t = (m + \xi) \cdot \tau_d \quad (1B)$$

In Equation (1B), $m \in \{0, 1, \ldots, 2^N-1\}$, and $0 \leq \xi \leq 1$. The first term in the bracketed portion of Equation (1A) (floor operation) provides the integer portion of normalized time difference $\Delta t/\tau_d$, indicated by m in Equation (1B), and the second term in the bracketed portion Equation (1A) (modulo operation) is the fractional portion of the normalized time difference $\Delta t/\tau_d$, indicated by $\xi$ in Equation (1B). Since the FSM 110 is free-running, the position in time of the start time $t_{start}$ relative to the position of the immediately preceding FSM state transition is random and uniformly distributed across an interval equal to the state dwell time $\tau_d$. At each reference signal period, an integer estimate M of the normalized time difference $\Delta t/\tau_d$ is obtained as the number of state transitions that occurred during the time difference Δt. Because the position of the start time $t_{start}$ relative to the position of the immediately preceding FSM state transition varies from sample to sample, some transition counts will include a final transition and some samples will preclude this transition. Thus, the integer estimate M is a stochastic variable and will be equal to either m or m+1 with a probability that depends on where the start time $t_{start}$ in FIG. 2A occurs relative to the immediate previous state transition of the FSM 110, as discussed below.

Figure 4A:
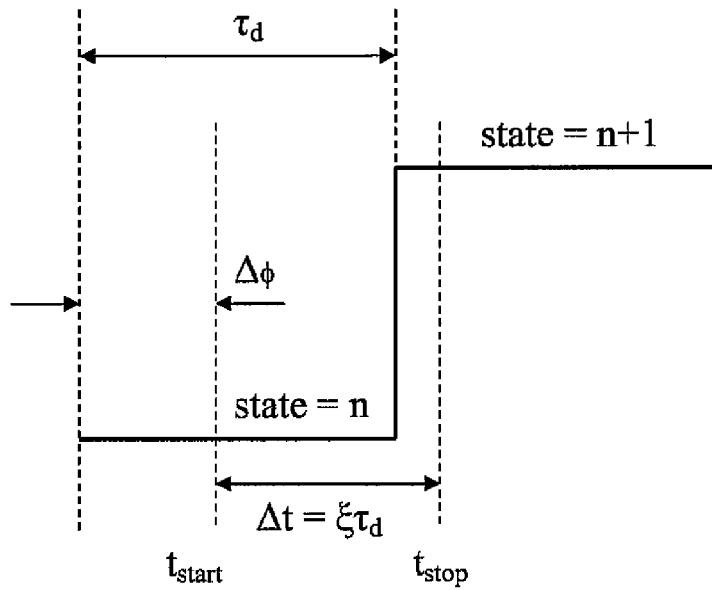
FIGS. 4A and 4B are timing charts showing time differences between a reference signal and an input signal relative to state transitions of a free-running finite state machine, according to a representative embodiment.
Figure 4B:
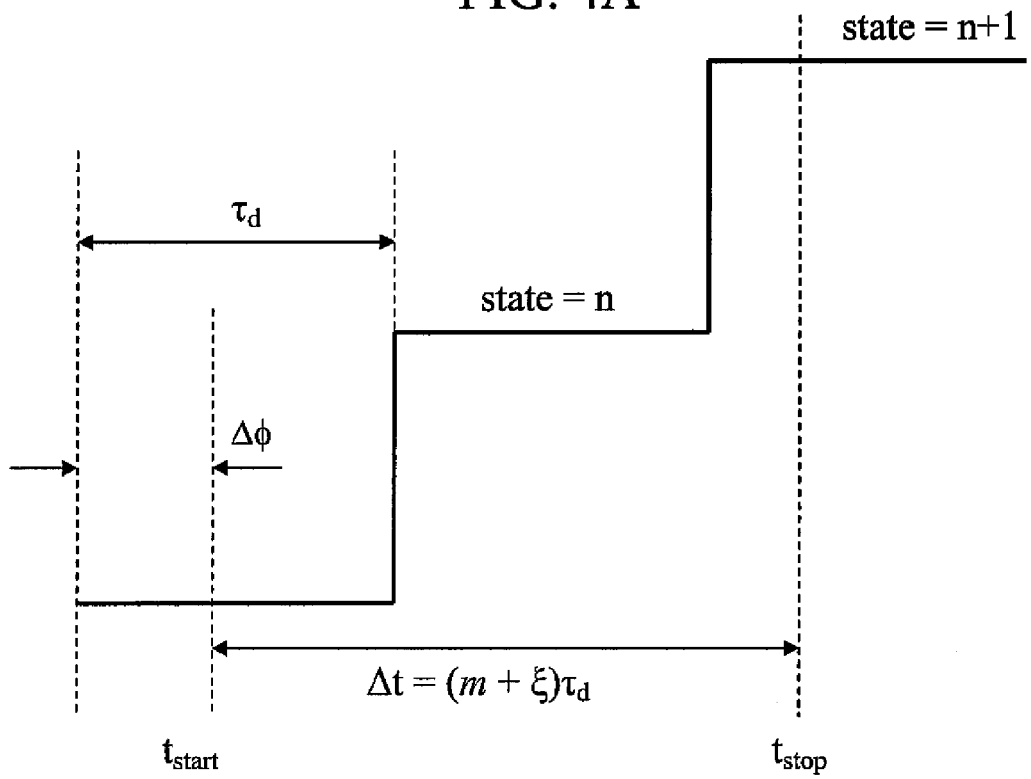

Referring to FIGS. 4A and 4B, random variable Δϕ, assumed to be uniform on $\{0, \tau_d\}$, describes the offset between the start time $t_{start}$ and the time of the previous state transition of the FSM 110. For each sample, the probability that the integer estimate M is equal to m (and not m+1) is given by Equations (2A) through (2E), as follows:

$$P[M = m] \quad (2A)$$

$$= P[\Delta\varphi + \Delta t \leq (m+1)\tau_d] \quad (2B)$$

$$= P[\Delta\varphi + (m+\xi)\tau_d \leq (m+1)\tau_d] \quad (2C)$$

$$= P[\Delta\varphi \leq \tau_d(1-\xi)] \quad (2D)$$

$$= 1 - \xi \quad (2E)$$

Equation (2E) follows Equation (2D) because the random variable Δϕ is uniform over the interval $\{0, \tau_d\}$ with cumulative distribution $F_{\Delta\Phi}(x) = P[\Delta\phi \leq x] = x/\tau_d$. Application of the exclusionary rule for bimodal distributions results in Equation (3):

$$P[M=m+1] = 1 - P[M=m] = \xi \quad (3)$$

Figure 5A:
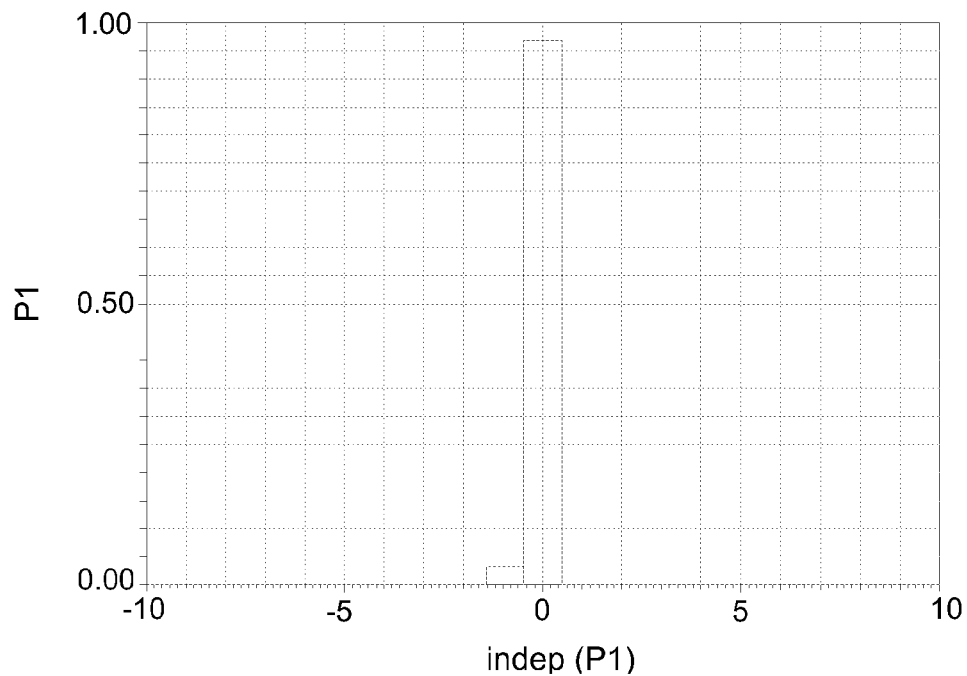
FIG. 5A is a graph showing a bimodal probability density function for a time difference between a reference signal and an input signal, according to a representative embodiment.

Thus, for example, suppose the time difference Δt is $3.6\tau_d$, then m=3, τ=0.6 and P[M=3]=0.4, P[M=4]=0.6. The probability density function of the sample outcome of FIG. 1 (integer estimate M) is bimodal. For example, FIG. 5A is a graph showing a bimodal probability density function for a time difference Δt=1 ps and a state dwell time $\tau_d$=8.7 ps, for example. The expected value of x, E[X], is provided according to Equations (4A) through (4D), as follows:

$$E[X] = \sum_{i=m}^{m+1} i \cdot P[X = i] \quad (4A)$$

$$= m(1 - \xi) + (m+1)\xi \quad (4B)$$

$$= m + \xi \quad (4C)$$

$$= \frac{\Delta t}{\tau_d} \quad (4D)$$

Thus, for a fixed and constant state dwell time $\tau_d$, by the Law of Large Numbers, the mean value of the state transition count samples converges to a value proportional to the time difference Δt. For ADPLL applications, the mean value can be extracted and used to drive the time difference Δt to zero, achieving phase lock. In these applications, it is sufficient to know the state dwell time $\tau_d$ to a fair approximation, since any error in the approximation results merely in a small loop-gain error, which has a negligible effect on performance. For time domain applications, the state dwell time $\tau_d$ is determined either through calibration or by phase locking the FSM 110 to a clock of known period.

As shown above with reference to FIGS. 2A, 2B, 4A and 4B, the time-to-digital conversion system 100 of FIG. 1 may be modeled by an equivalent stochastic model. That is, as discussed above, the FSM 110 provides the random variable Δϕ, uniform on the interval $\{0, \tau_d\}$, which is added to the time difference Δt and quantized modulo $2^N$ with a step-size equal to the state dwell time $\tau_d$. Thus, the time-to-digital conversion system 100 of FIG. 1 is stochastically equivalent to a quantizer with additive uniform dither, which enables use of well developed system models for analysis. However, unlike most dithered quantizers, the noise variance in the present embodiments diminishes as the time difference Δt goes toward zero, as discussed below.

Generally, additive dither adds input-dependent excess noise power. For a constant time difference Δt, the noise power is equal to the variance of the quantized output, which is derived as shown by Equations (5A) through (5E), in which x is equal to the normalized time difference $\Delta t/\tau_d$:

$$\text{Var}[X] = \sum_{i=m}^{m+1} (X - E[X])^2 P[X = i] \quad (5A)$$

$$= (m - (m+\xi))^2(1-x) + (m+1-(m+\xi))^2 x \quad (5B)$$

$$= \xi^2 + x(1 - 2\xi) \quad (5C)$$

$$= (x - \lfloor x \rfloor)^2 + x[1 - 2(x - \lfloor x \rfloor)] \quad (5D)$$

$$= x(1 - x) + \lfloor x \rfloor^2 \quad (5E)$$

Figure 5B:
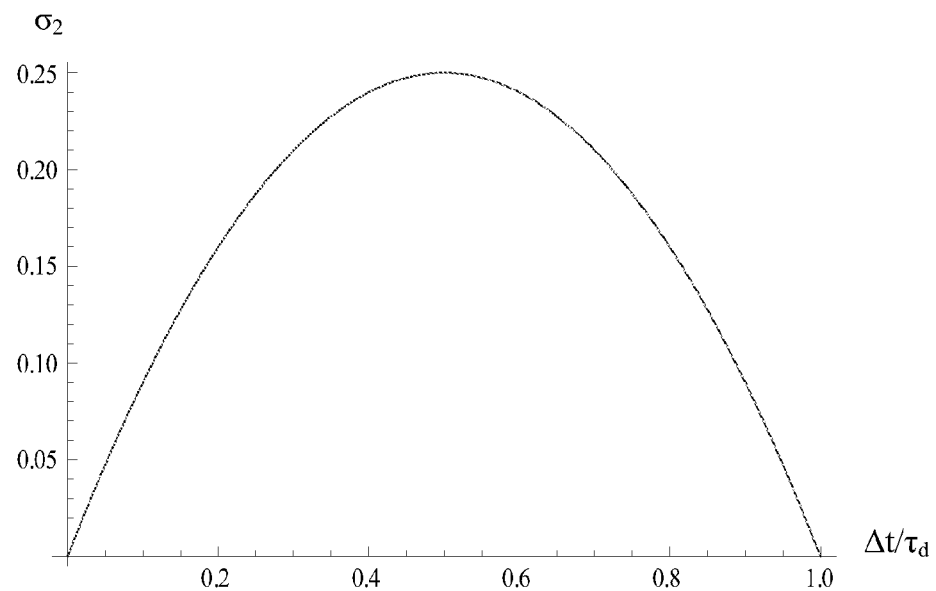
FIG. 5B is a graph showing the noise power versus normalized time difference, according to a representative embodiment.

FIG. 5B is a graph showing the noise power ($\sigma^2$), indicated by the variance of the quantized output of the time-to-digital conversion system 100, versus the normalized time difference x for $0 \leq x \leq 1$. As shown in FIG. 5B, the noise power generated by the time-to-digital conversion system 100 varies with the input time difference Δt, such that the noise power (variance) is maximum at x=0.5 when there is 50 percent probability that a state transition will lie within the time difference Δt, yielding an equal probability of recording m or m+1 at the output. As x increases, the probability of capturing a state transition increases, raising the probability of recording m+1, thus decreasing the variance at the output. Likewise, the probability of capturing a state transition decreases as the time difference Δt goes to zero, raising the probability of recording m and likewise reducing the variance of the output.

Ultimately, the added noise power ($\sigma^2$) goes to zero as the time difference Δt vanishes. Therefore, in ADPLL applications, which are generally operated at the lock point defined by the time difference Δt=0, the excess noise contribution of the dither vanishes, and phase noise performance is nearly equivalent to an oversampled non-dithered quantizer with radian phase quantized step-size $q_\theta$, where $q_\theta = 2\pi f_{ref} \tau_d$. Simulations have shown that the excess noise is much less than the quantization noise. Thus, according to various embodiments, linearization benefits of a dithered system are obtained without the noise penalty normally associated with additive dither.

Figure 6:
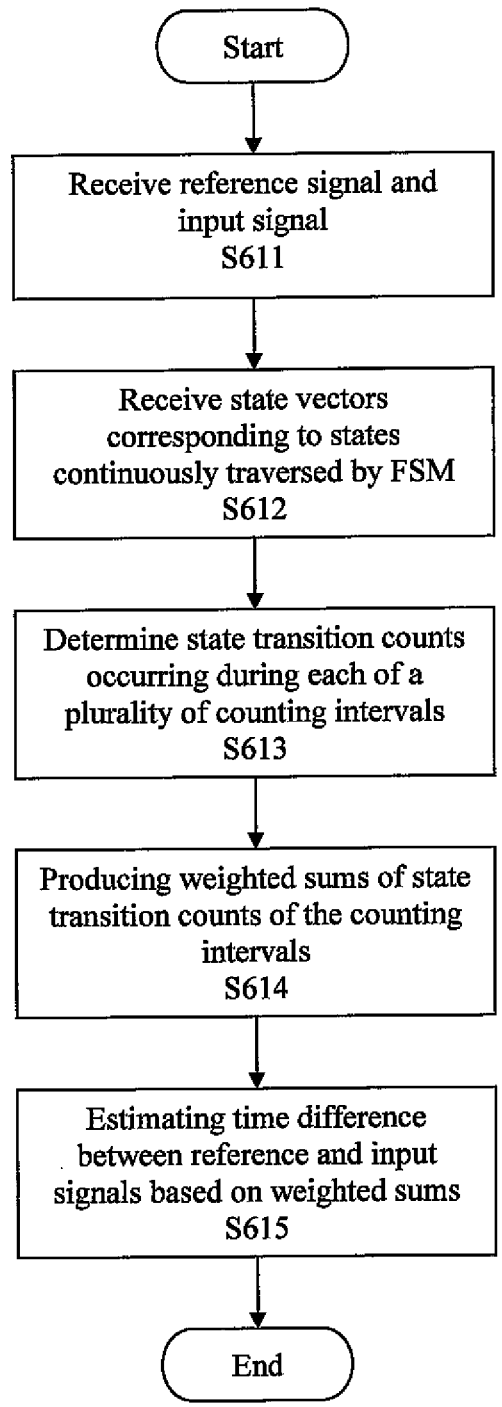
FIG. 6 is a flowchart illustrating a method of performing time-to-digital conversion, according to a representative embodiment.

FIG. 6 is a flowchart illustrating a method for determining a digital representation of a time difference between a reference signal and an input signal. The method may be implemented in whole or in part by a processing device, such as a processor or central processing unit (CPU), application specific integrated circuits (ASICs), field-programmable gate arrays (FPGAs), or combinations thereof, using software, firmware, hard-wired logic circuits, or combinations thereof.

When using a processor or CPU, a memory is included for storing executable software/firmware and/or executable code that enables performance of the various functions. The memory may be any number, type and combination of non-volatile read only memory (ROM) and volatile random access memory (RAM), and may store various types of information, such as computer programs and software algorithms executable by the processor or CPU. The memory may include any number, type and combination of tangible computer readable storage media, such as a disk drive, an electrically programmable read-only memory (EPROM), an electrically erasable and programmable read only memory (EEPROM), a CD, a DVD, a universal serial bus (USB) drive, and the like.

Referring to FIG. 6, a reference signal and an input signal are received in block S611 (e.g., by timing circuit 120). The reference signal has a reference signal period, and the input signal has an input signal period which is equal to the reference signal period, on average. State vectors of a free-running FSM (e.g., FSM 110) are received in block S612. The state vectors correspond to a multiplicity of states periodically and continuously traversed by the FSM 110 in a predetermined order, and each state vector is held for a constant state dwell time $\tau_d$ occurring between state transitions, as discussed above.

In block S613, state transition counts occurring during each of multiple counting intervals are determined based on the received state vectors. Each state transition count provides the number of state transitions that occur in the FSM 110 during a corresponding counting interval. As discussed above, each counting interval indicates the time difference $\Delta t$ between the reference signal and the input signal for each reference signal period. For example, each counting interval may be defined by a start time corresponding to a predetermined level of the reference signal and a stop time corresponding to a predetermined level of the input signal, examples of which are shown in FIGS. 4A and 4B. Also, each state (and corresponding state vector) is held for a predetermined state dwell time (e.g., state dwell time $\tau_d$), and the states are repeated according to a period of the FSM, which is independent of and less than the reference signal period and the input signal period, as discussed above.

Weighted sums of state transition counts of the counting intervals are produced in block S614. The weighted sums are convergent to the time difference $\Delta t$ between the reference signal and the input signal. Therefore, the time difference $\Delta t$ between the reference signal and the input signal is estimated (or approximated) in block S615 based on weighted sums. As discussed above, the weighted sums may be obtained by applying weighting coefficients to a digital low-pass filter (e.g., digital low-pass filter 150), for example. When the weighting coefficients are equal to one, application of the weighted sums averages the state transition counts of the counting intervals, thus providing an average state transition count indicating the time difference $\Delta t$ between the reference clock and the input signal. In various embodiments, a large number of counting intervals are sampled in order to provide a large set for calculating the average state transition count. Also, as discussed above, the weighted sums may be down sampled to a rate lower than that of the reference signal.

Of course, in a ADPLL implementation, the estimated time difference $\Delta t$ determined in block S615 may be fed back to adjust the timing (or phase) of the input signal in order to better align the input signal with the reference signal, as discussed above with reference to FIG. 3.

Figure 7:
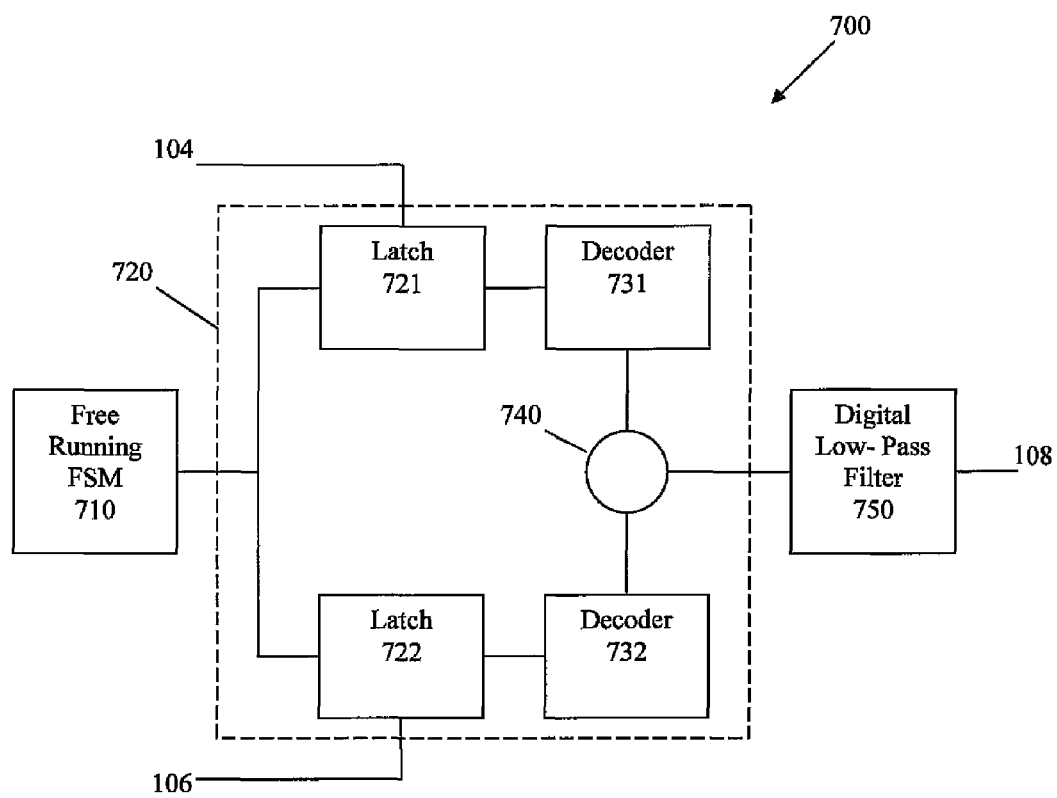
FIG. 7 is a block diagram illustrating a time-to-digital conversion system, according to another representative embodiment.

FIG. 7 is a block diagram showing an illustrative system for performing time-to-digital conversion to provide a digital representation of a time difference between a reference signal and an input signal, according to a representative embodiment.

Referring to FIG. 7, time-to-digital conversion system 700 includes free-running FSM 710 and digital low-pass filter 750, which are substantially the same as the FSM 110 and the digital low-pass filter 150 discussed above with reference to FIG. 1. The time-to-digital conversion system 700 further includes timing circuit 720 as the timing circuit 120 in FIG. 1.

The timing circuit 720 includes first latch 721, first decoder 731, second latch 722, second decoder 732 and difference circuit 740. The first decoder 731 is connected to an output of the first latch 721, and the second decoder 732 is connected to an output of the second latch 722. The first latch 721 receives the reference signal 104, and the second latch 722 receives the input signal 106. The difference circuit 740 is connected to the outputs of the first and second decoders 731 and 732, and the digital low-pass filter 750 is connected to the output of the difference circuit 740.

The FSM 710 is connected to both the first latch 721 and the second latch 722. The FSM 710 may be a ring oscillator, for example, although other types of FSM may be incorporated without departing from the scope of the present teachings. In order to sample the states of the FSM 710, the first latch 721 latches first state vectors of the FSM 710 corresponding to the start time $t_{start}$ of each reference signal period $T_{ref}$ of the reference signal 104, and the second latch 722 latches second state vectors of the FSM 710 corresponding to stop time $t_{stop}$ of each input signal period $T_{in}$ of the input signal 106, providing a sampling pair that includes a start sample corresponding to the reference signal period $T_{ref}$ and a stop sample corresponding to the input signal period $T_{in}$. The latching may be triggered, for example, by the transitions (rising or falling edges) of the reference signal 104 and the input signal 106, respectively.

The first decoder 731 receives the first state vectors from the first latch 721, and decodes the first state vectors into first disambiguated state values based on the first state vector value and the FSM counting direction. Likewise, the second decoder 732 receives the second state vectors from the second latch 722, and decodes the second state vectors into second disambiguated state values.

The difference circuit 740 determines a state transition count equal to the number of FSM state transitions that occurred during a counting interval (the time difference $\Delta t$) from the differences between each first disambiguated state value received from the first decoder 731, and a corresponding second disambiguated state value received from the second decoder 732. The difference circuit 740 may be an adder, for example, where one of the first decoder 731 or the second decoder 732 is configured to provide inverted disambiguated state values to produce a state transition count. Alternatively, the difference circuit 740 may be a subtractor. In an embodiment, the difference circuit 740 outputs state transition count M at each reference signal period, as discussed above with reference to Equation (1B).

In an embodiment, the digital low-pass filter 750 averages the state transition counts received from difference circuit 740 to provide an average state transition count as output signal 108, which indicates the ratio of time difference $\Delta t$ (between the reference signal 104 and the input signal 106) and the FSM state dwell time $\tau_d$. In an embodiment, the digital low-pass filter 750 may be included in a decimation circuit, which also includes a down-sampler (not shown). The decimation circuit thus functions as an averaging down sampler that receives the state transition counts from the difference circuit 740 at the reference signal frequency, averages a fixed number of samples via the digital low-pass filter 750, and outputs the result at a lower (down sampled) rate. This decimation operation effectively increases the time resolution of the time-to-digital conversion system 700. For example, when eight decoded time differences corresponding to eight corresponding sampling pairs from the first and second latches 721 and 722 are averaged, the resulting output from the decimation circuit has one-eighth the rate of the reference signal 104 and the input signal 106, and the timing resolution is increased by a factor of eight.

In various embodiments, the digital low-pass filter 750 may be implemented as any type of digital filter, such as a polyphase filter, a finite impulse response (FIR) filter, or the like. When used in a decimation circuit, the digital low-pass filter 750 is followed (or preceded) by a down sampler to provide the average state transition counts at a lower rate, without departing from the scope of the present teachings. That is, the digital low-pass filter 750 receives the state transition counts from the difference circuit 740 and applies filter weighting coefficients in order to output corresponding weighted sums that are convergent to the time difference between the reference signal 104 and the input signal 106. When the weighting coefficients are unity, the weighted sums provide the average state transition count, as discussed above. Without a down sampler, the rate of the output of the digital low-pass filter 750 is equal to that of the reference signal 104.

The components of the time-to-digital conversion system 700 may be implemented by various means, without departing from the scope of the present teachings. For example, FIG. 8 is a block diagram illustrating a time-to-digital conversion system, according to a representative embodiment, including illustrative configurations of various components.

Figure 8:
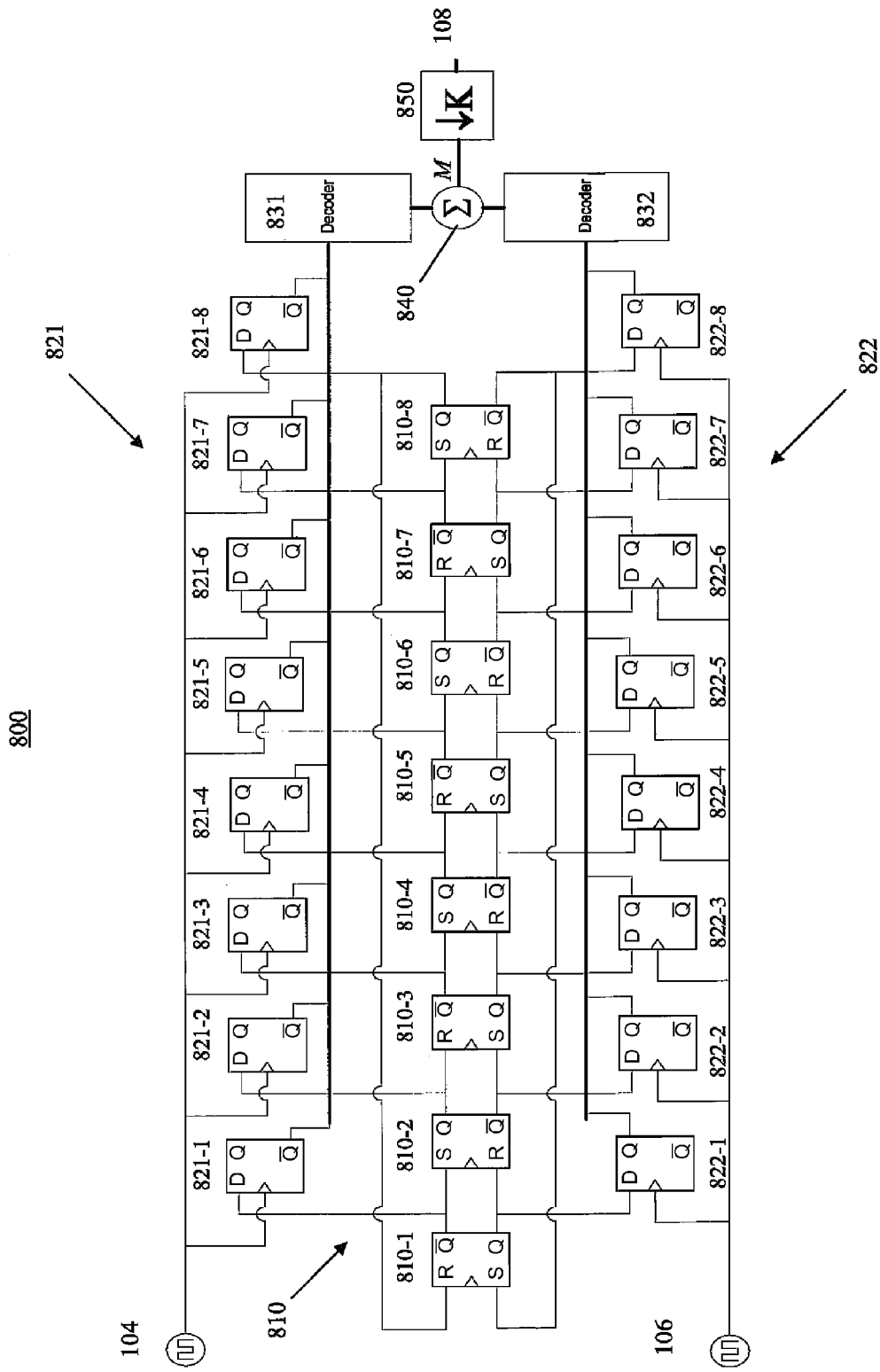
FIG. 8 is a block diagram illustrating a ring oscillator and latches in a time-to-digital conversion system, according to a representative embodiment.

Referring to FIG. 8, the time-to-digital conversion system 800 includes ring oscillator 810, which functions as a free-running FSM. In the depicted illustrative configuration, the ring oscillator 810 includes eight cross-connected SR latches 810-1 to 810-8 to provide 16 phases. The SR latches 810-1 to 810-8 are alternately inverted, such that the S input of every other SR latch receives an inverted output $\overline{Q}$ of the previous SR latch, while the R inputs of every other SR latch receive a non-inverted output Q of the previous SR latch. For example, the ring oscillator 810 may be implemented using a 130 micron CMOS model, which results in a state dwell time $\tau_d$ equal to about 8.7 ps and an oscillation frequency of about 7.6 GHz. The use of SR latches 810-1 to 810-8 rather than inverters provide well-defined states to first and second decoders 831 and 832, discussed below. At any sample time, the state vector of the ring oscillator 810 is defined as the states of the individual stages of the SR latches 810-1 to 810-8 at that instant.

The time-to-digital conversion system 800 further includes first latch 821 formed by a series of first D flip-flops 821-1 to 821-8 and second latch 822 formed by a series of second D flip-flops 822-1 to 822-8. In the depicted illustrative configuration, each of the D flip-flops 821-1 to 821-8 in the first latch 821 receives reference signal 104 and alternating inverted outputs $\overline{Q}$ and non-inverted outputs Q from the SR latches 810-1 to 810-8 in the ring oscillator 810 in order to sample state vectors of the ring oscillator 810 according to the reference signal 104. The inverted outputs $\overline{Q}$ of the D flip-flops 821-1 to 821-8 in the first latch 821 are connected to first decoder 831. Similarly, each of the D flip-flops 822-1 to 822-8 in the second latch 822 receives input signal 106 and alternating non-inverted outputs Q and inverted outputs $\overline{Q}$ from the SR latches 810-1 to 810-8 in the ring oscillator 810 in order to sample state vectors of the ring oscillator 810 according to the input signal 106. The non-inverted outputs Q of the D flip-flops 822-1 to 822-8 in the second latch 822 are connected to second decoder 832. By utilizing the inverted outputs $\overline{Q}$ of the D flip-flops 821-1 to 821-8 in the first latch 821 and the non-inverted outputs Q of the D flip-flops 822-1 to 822-8 in the second latch 822, the difference circuit 840 may be implemented as an adder, for example, as shown.

Figure 10:
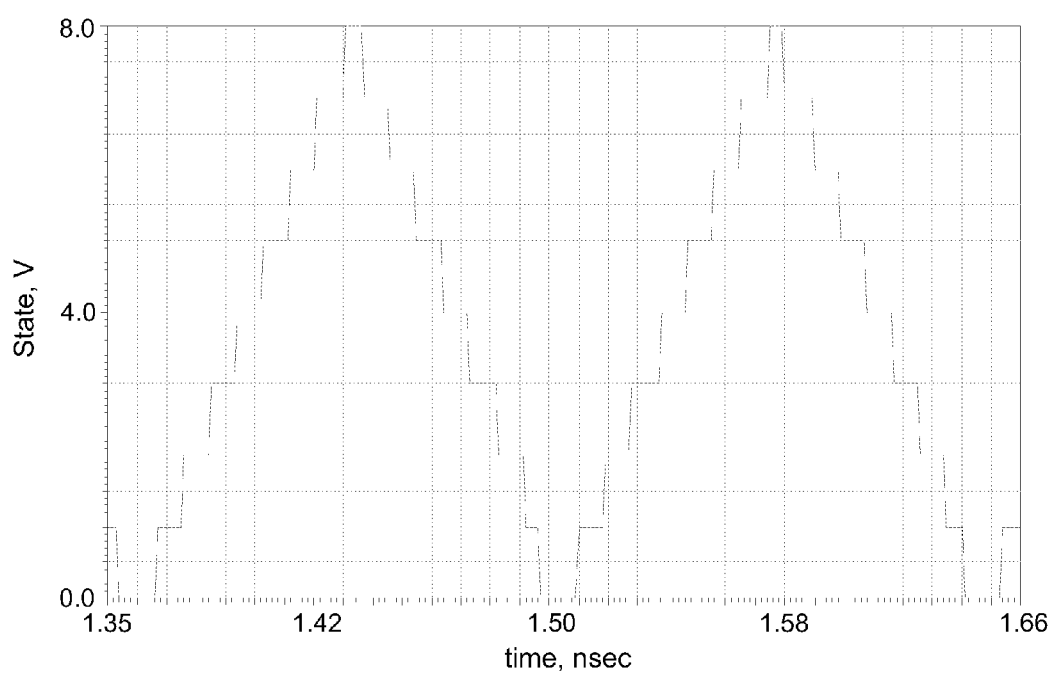
FIG. 10 is a timing chart showing state dwell times corresponding to state transitions of a free-running finite state machine, according to a representative embodiment.

In the depicted configuration, the state vectors of the ring oscillator 810, defined to be the total number of non-inverted outputs Q set high, may advance as shown in FIG. 10. Assuming that the ring oscillator 810 begins at a zero state with all non-inverted inputs Q set low and the input set to stage 1 {S, R}={1, 0}, the one will propagate through each successive stage with the state vectors stepping from 0 to $2^{(N-1)}-1$, at which point the input to stage 1 changes to {0,1}. Zero propagation begins, stepping the state vectors back down to zero at which point the process repeats. The eight upward steps and subsequent eight downward steps of the state vectors correspond to the eight SR latches 810-1 to 810-8 in the representative ring oscillator 810, and thus more or fewer steps may occur in alternative configurations including a ring oscillator having more or fewer SR latches. Since each state vector traversed during the one propagation (up counting) is repeated during the zero propagation (down counting), a decoder is required to disambiguate the state vector association, as discussed below.

Figure 9:
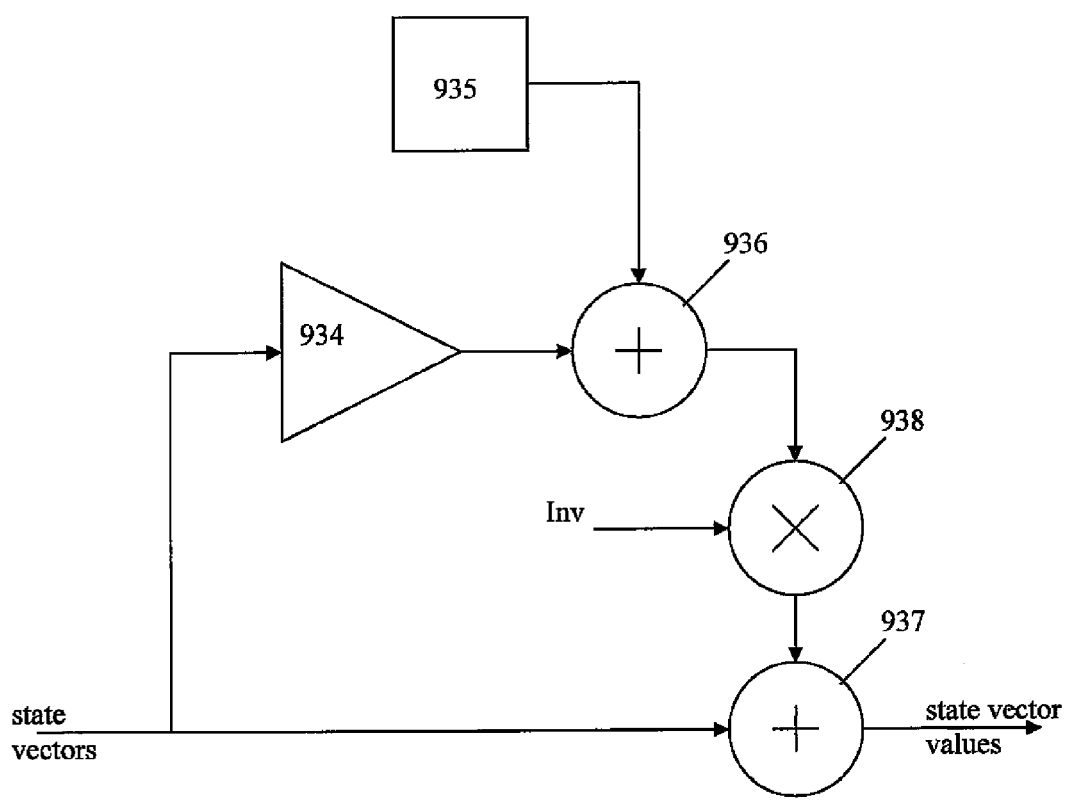
FIG. 9 is a block diagram illustrating a decoder in a time-to-digital conversion system, according to a representative embodiment.

FIG. 9 is a block diagram illustrating a representative decoder in a time-to-digital conversion system, according to a representative embodiment. Referring to FIG. 9, the decoder 930 is representative of both the first and second decoders 831 and 832 shown in FIG. 8. The decoder 930 maps the triangle waveform of FIG. 10 to the saw tooth waveform of FIG. 2B by inverting and offsetting the portion of the triangle waveform of FIG. 10 with negative slope. The decoder 930 receives state vectors from a latch (e.g., first latch 821 or second latch 822) and a constant offset value 935 used to offset the negative sloping portion of the waveform, and outputs respective quantized time values. The multiplier 938 in FIG. 9 is modeling a simple gate, with Inv=0 during the positive sloped region and Inv=1 during the negative sloped region of the steps in FIG. 10. Thus, the positive slope region is passed unchanged through adder 937, while the negative sloped region is inverted and amplified by gain block 934 and offset by constant offset value 935 in adder 936, such that when added to the unmodified negative slope region in adder 937, the saw tooth waveform of FIG. 2B results.

The decoder 930 outputs disambiguated state vector values. For example, referring again to FIG. 8, the outputs of the first and second decoders 831 and 832 are first and second disambiguated state vector values, respectively, which are input to the difference circuit 840. The difference circuit 840 subtracts the first and second disambiguated state vector values and provides quantized normalized time differences as the state transition counts, which may be indicated by integer estimate M of the normalized time difference $\Delta t/\tau_d$, as discussed above. The result is interpreted as a two's complement number, so that an absolute value |M| greater than or equal to $2^{(N-1)}$ indicates the start edge lagged (rather than led) the closest stop edge. The state transition counts are input to the decimation circuit 850 to be averaged. As discussed above, the decimation circuit 850 may be implemented by a digital filter, such as a digital low-pass filter, and a down sampler, indicated by the down arrow.

Figure 11:
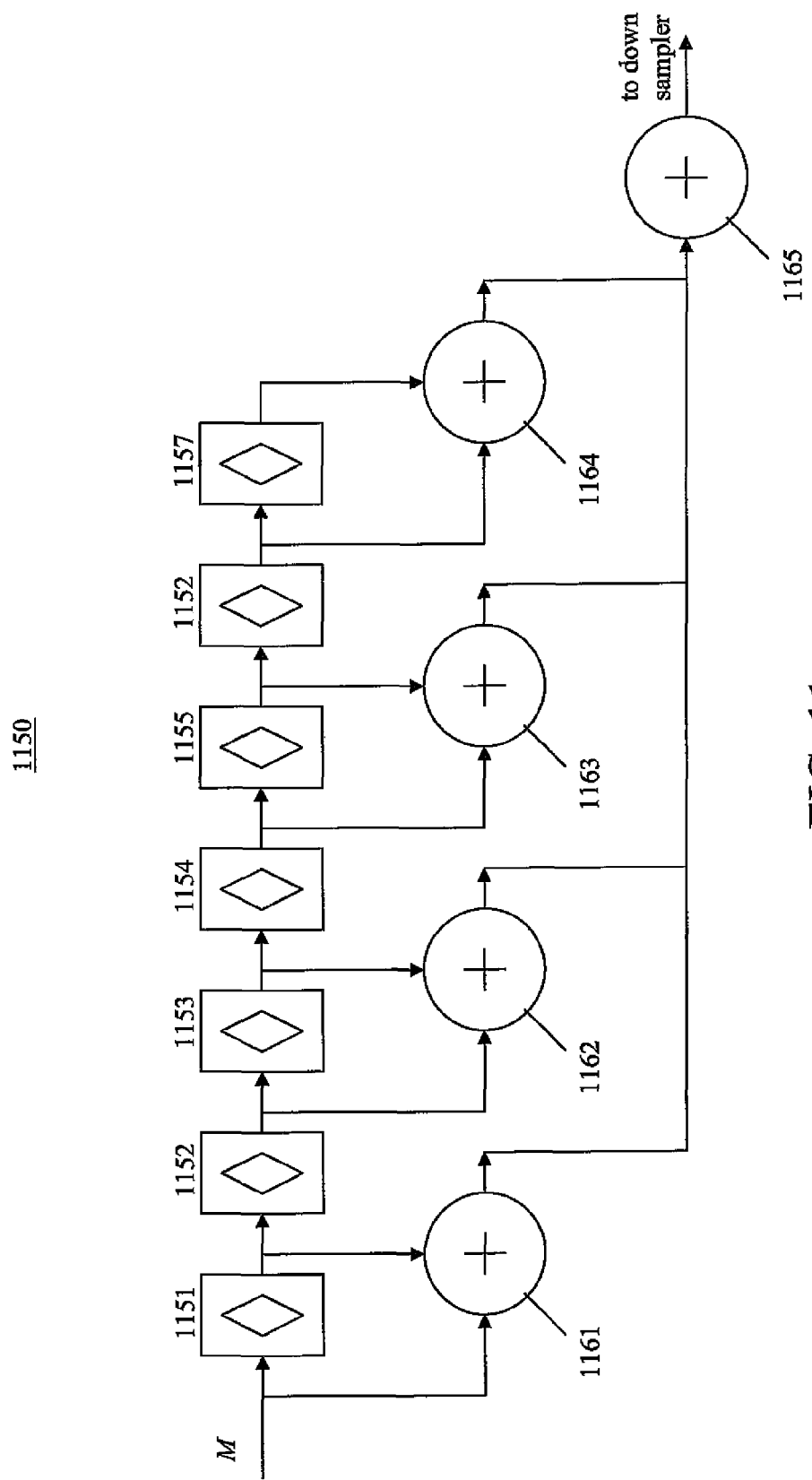
FIG. 11 is a block diagram illustrating digital filter portion of an averaging decimation circuit in a time-to-digital conversion system, according to a representative embodiment.

FIG. 11 is a block diagram illustrating a representative digital filter portion of an averaging decimation circuit in a time-to-digital conversion system, according to a representative embodiment. Referring to FIG. 11, representative digital low-pass filter 1150 of decimation circuit 850 in FIG. 8 includes delay circuits 1151-1157 and binary adders 1161-1165 connected in series, which provide a block average of the last eight state transition counts M input to the decimation circuit 850 by the difference circuit 840. Thus, eight decoded M values are averaged to produce an average state transition count as output signal 108 at one-eighth the rate or frequency of the reference signal 104 (right shift). Alternatively, a block gain of eight may be provided by eliminating the binary shift. Of course, in an alternative configuration, the input of the digital low-pass filter 1150 may be connected to a down sampler, rather than the output, without departing from the scope of the present teachings.

The digital low-pass filter provides a block average because the weighting coefficients, applied to multipliers (not shown) respectively located at each of the inputs of the binary adders 1161-1164, are assumed to be one. In alternative embodiments, the weighting coefficients may be set to values other than one to obtain an output of the digital low-pass filter 1150 representative of the quantized normalized time differences between the first and second quantized time values, but not necessarily the average, as would be apparent to one of ordinary skill in the art. In other alternative embodiments, the down sampler may be eliminated and a moving average may be obtained at the output of the digital low-pass filter at a sample rate equal to the reference rate.

The decoded state transition counts, output by the difference circuit 840 and down sampled by the decimation circuit 850, further enable the DAC and digital filter in an ADPLL (similar to ADPLL 300 shown in FIG. 3, for example) containing the time-to-digital conversion system 800 to be operated at a lower clock rate. By using an averaging down sampler, such as decimation circuit 850, no information is lost and the signal-to-noise ratio (SNR) is preserved by operation of the decimation circuit 850. In phase-lock loop applications, the loop filter functions may be incorporated into the digital low-pass filter without departing from the scope of the present teachings.

Referring again to FIGS. 7 and 8, the illustrative circuits are effective when the time difference Δt between the reference signal 104 and the input signal 106 is less than or equal to the FSM period $T_{FSM}$. Therefore, when the FSM 110 is a 16 state ring oscillator, such as the ring oscillator 810, for example, with a state dwell time $\tau_d$ of about 8.7 ps, as discussed above, the range of the time-to-digital conversion system 100, 800 is limited to about 140 ps (±70 ps). Although such capabilities and range are acceptable for use in an ADPLL implementation, for example, they may be overly restrictive of other applications.

Figure 12:
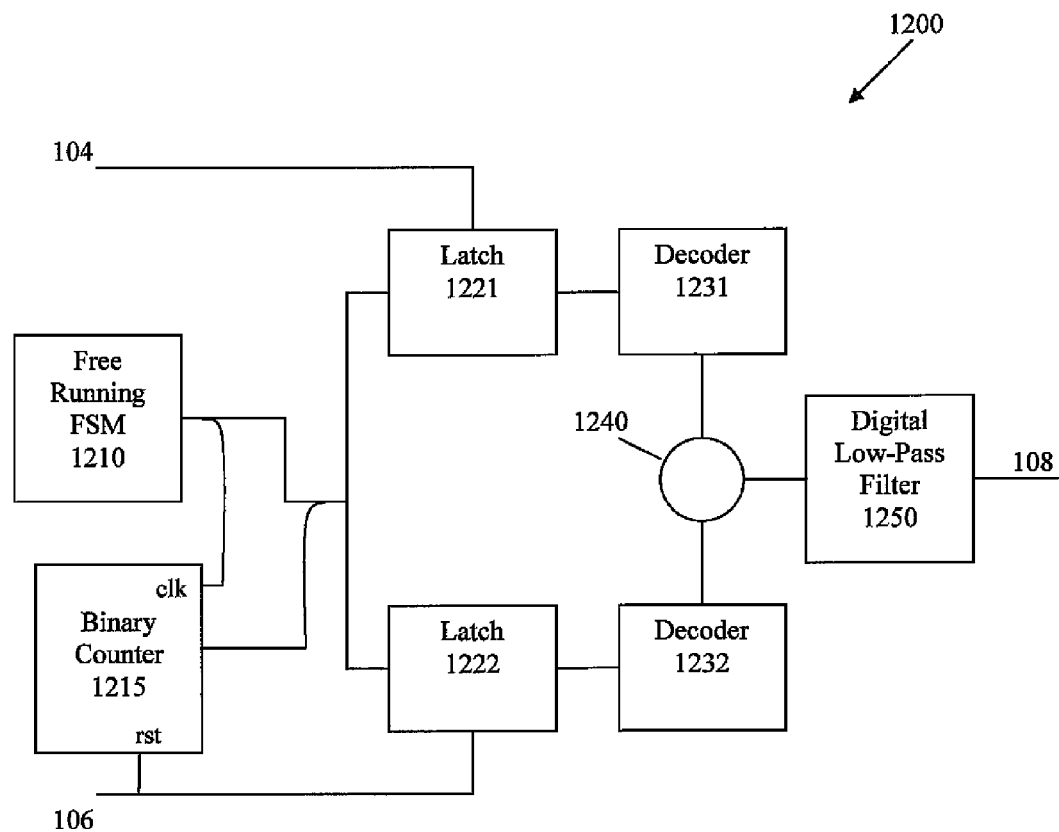
FIG. 12 is a block diagram illustrating a means of extending operating range of a time-to-digital conversion system, according to another representative embodiment.

To extend the range, a binary counter may be clocked from the final stage of the ring oscillator, as shown in FIG. 12, for example, which is a block diagram showing an illustrative system for performing time-to-digital conversion to provide a digital representation of a time difference between a reference signal and an input signal, according to another representative embodiment.

Referring to FIG. 12, time-to-digital conversion system 1200 includes first latch 1221 that receives the reference signal 104, and second latch 1222 that receives the input signal 106. The time-to-digital conversion system 1200 also includes first decoder 1231 connected to an output of the first latch 1221, second decoder 1232 connected to an output of the second latch 1222, difference circuit 1240 connected to the outputs of the first and second decoders 1231 and 1232, and digital low-pass filter 1250 connected to the output of the difference circuit 1240. The first latch 1221, the second latch 1222, the first decoder 1231, the second decoder 1232, the difference circuit 1240, and the digital low-pass filter 1250 are configured and operate substantially the same as discussed above with respect to the first latch 721, 821, the second latch 722, 822, the first decoder 731, 831, the second decoder 732, 832, the difference circuit 740, 840, and the digital low-pass filter 750 and/or decimator circuit 850, and thus the descriptions will not be repeated.

The time-to-digital conversion system 1200 also includes free running FSM 1210 configured to traverse periodically a multiplicity of states, which are sampled by the first and second latches 1221 and 1222 under control of the reference signal 104 and the input signal 106, respectively. The FSM 1210 may be a ring oscillator, for example, as discussed above with reference to ring oscillator 810 of FIG. 8. In addition, the time-to-digital conversion system 1200 includes binary counter 1215, configured to receive the output of the FSM 1210 as a clock signal and to receive the input signal 106 as a reset signal. The output of the binary counter 1215 is connected to the output of the FSM 1210 to provide an additional number of states available for sampling, e.g., by the first and second latches 1221 and 1222 under control of the reference signal 1204 and the input signal, respectively, thus extending the range of the time-to-digital conversion system 1200 over the range that would be otherwise available using only the FSM 1210.

As stated above, the binary counter 1215 is clocked from the final stage of the FSM 1210. Thus, the first and second decoders 1231 and 1232 do not modify the upper P bits of their inputs as these bits are already binary encoded. For example, when the FSM 1210 outputs four bits (N=4) (e.g., when there are 16 FSM states) and the binary counter 1215 provides nine additional bits (P=9), the difference circuit 1240 outputs 13-bit words. When the digital low-pass filter 1250 is a decimation circuit, for example, it includes a downsampler to provide a down sample ratio of eight (K=8), which yields an additional three bits due to averaging. In this case, the resulting 16-bit words of the output signal 108 have about 1 ps resolution and 65 ns of range. This would accommodate a fractional-N divider in the feedback loop of an ADPLL (e.g., ADPLL 300 in FIG. 3), which has edge jitter on the order of about 5 ns.

The various embodiments described herein may be applied, for example, to implementation of high-frequency ADPLLs, and provide superior noise performance at reduced cost and complexity. Using ADPLLs in applications in which analog PLLs are currently used provides improvements in size, power and cost, and noise performance. Also, ADPLLs provide the ability to dynamically change loop bandwidths (for example as a function of sweep time in a spectrum analyzer or FM bandwidth in a source) to optimize tracking versus acquisition or noise performance, to provide high-reuse synthesizers, and to improve spurious over fractional-N designs. Embodiments may also be used for various other applications, such as jitter/BERT testing, time synchronization, clock recovery, and the like.

Figure 13:
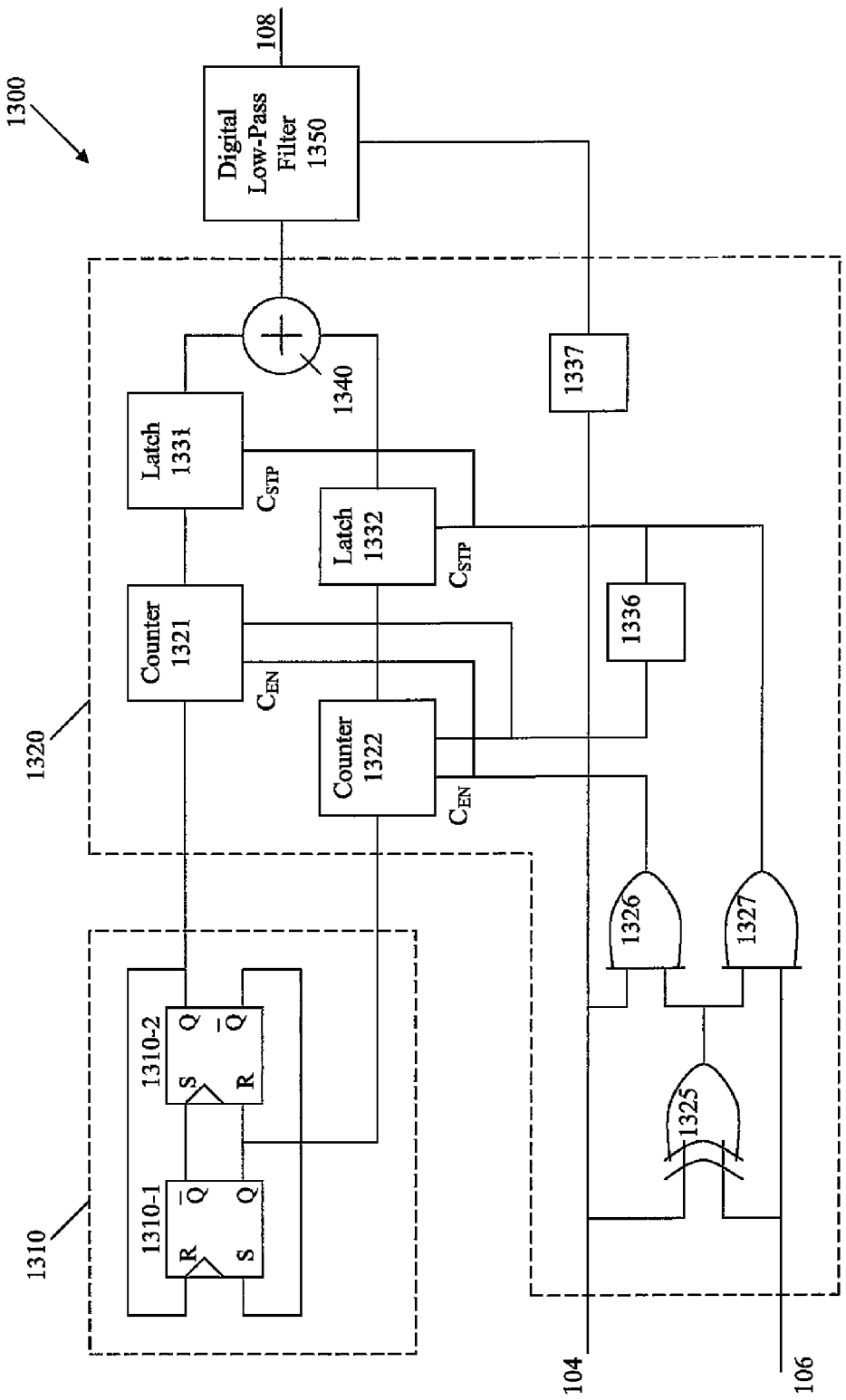
FIG. 13 is a block diagram illustrating a time-to-digital conversion system, according to another representative embodiment.

FIG. 13 is a block diagram showing an illustrative system for performing time-to-digital conversion to provide a digital representation of a time difference between a reference signal and an input signal, according to another representative embodiment.

Referring to FIG. 13, time-to-digital conversion system 1300 includes digital low-pass filter 1350, which is substantially the same as the digital low-pass filter 150 discussed above with reference to FIG. 1. In the depicted embodiment, the time-to-digital conversion system 1300 further includes free-running FSM 1310 and timing circuit 1320 as the FSM 110 and the timing circuit 120 in FIG. 1, respectively.

In the depicted embodiment, the FSM 1310 is implemented as a ring oscillator, including two cross-connected SR latches 1310-1 to 1310-2 to provide four phases. The SR latch 1310-2 has an S input connected to an inverted output $\overline{Q}$ of the SR latch 1310-1, and an R input connected to a non-inverted output Q of the SR latch 1310-1. Likewise, the SR latch 1310-1 has an S input connected to an inverted output $\overline{Q}$ of the SR latch 1310-2, and an R input connected to a non-inverted output Q of the SR latch 1310-2.

The non-inverted outputs Q of the SR latches 1310-1 and 1310-2 are connected to clock inputs of the first counter 1321 and the second counter 1322 of the timing circuit 1320, respectively. Both first and second counters 1321 and 1322 are included because a single counter, assuming it is edge triggered on a positive edge, for example, would count the positive edges (count up), but miss the corresponding negative edges (count down). Therefore, first and second counters 1321 and 1322 are used to separately count the positive edges twice to account for both the positive and negative edge transitions. The timing circuit 1320 further includes first latch 1331 connected to an output of the first counter 1321, and second latch 1332 connected to an output of the second counter 1322. The outputs of the first and second latches 1331 and 1332 are input to an adder 1340.

The reference signal 104 and the input signal 106 are input to a logic circuit of the timing circuit 1320, including exclusive OR (XOR) gate 1325, first AND gate 1326 and second AND gate 1327. More particularly, the XOR gate 1325 receives the reference signal 104 and the input signal 106 as inputs, the AND gate 1326 receives the reference signal 104 and the output of the XOR gate 1325 as inputs, and the AND gate 1327 receives the input signal 106 and the output of the XOR gate 1325 as inputs.

In the depicted embodiment, it is assumed that the reference signal 104 and the input signal 106 are periodic square waves, such as reference and input clock signals, respectively. However, the reference signal 104 and the input signal 106 do not need to be square waves, but rather may be sine waves, for example, without departing from the scope of the present teachings. When the reference signal 104 and the input signal 106 are sine waves, they are initially converted to square waves. For example, the reference signal 104 may be input to a first comparator (not shown), which compares the sine wave reference signal 104 with a first reference voltage Vref and outputs a corresponding square wave reference signal 104. Likewise, the input signal 106 may be input to a second comparator (not shown), which compares the sine wave input signal 106 with a second reference voltage Vin and outputs a corresponding square wave input signal 106.

The output of the first AND gate 1326 provides count enable signal $C_{EN}$ to enable inputs of the first and second counters 1321 and 1322, respectively. The output of the second AND gate 1327 provides count stop signal $C_{STP}$ to load inputs of the first and second latches 1331 and 1332, respectively. The output of the second AND gate 1327 also provides the count stop signal $C_{STP}$ to reset inputs of the first and second counters 1321 and 1322, respectively, through first delay element 1336, which may be implemented as a logic gate or inverter, for example. The reference signal 104 is provided to a clock input of the low-pass filter 1350 through second delay element 1337.

In the depicted configuration, the FSM 1310 is shown as having two states through which it transitions. Alternative embodiments, the FSM 1310 may have additional states, without departing from the scope of the present teachings, although such embodiments would require corresponding additional counters and latches. The first and second counters 1321 and 1322 count state transitions of the FSM 1310 that occur during each counting interval, where the counting interval corresponds to the time difference Δt between the reference signal 104 and the input signal 106, as discussed above. The beginning (start time $t_{start}$) of each counting interval is determined by the count enable signal $C_{EN}$ received by the first and second counters 1321 and 1322, and the end of each counting interval (stop time $t_{stop}$) is determined by the count stop signal $C_{STP}$, which causes the first and second latches 1331 and 1332 to latch the current counts of the first and second counters 1321 and 1322, respectively, at the end of the counting interval. The count stop signal $C_{STP}$ also resets the first and second counters 1321 and 1322 to begin counting the number of state transitions of the FSM 1310 for the next counting interval.

The latched number of state transitions is output by the first and second latches 1331 and 1332 to the adder 1340, which determines the state transition count of each counting interval. The digital low-pass filter 1350 produces weighted sums (averages) of the state transition counts output by the adder 1340 of the timing circuit 1320. The weighted sums are indicative of the ratio between the counting interval and the predetermined and essentially constant state dwell time $\tau_d$ of the FSM 1310, as discussed above. Also, the delayed reference signal 104 is provided to the digital low-pass filter 1350 as a delayed clock in order to allow the calculation of integer estimate M to occur prior to being processed by the filter.

Figure 14:
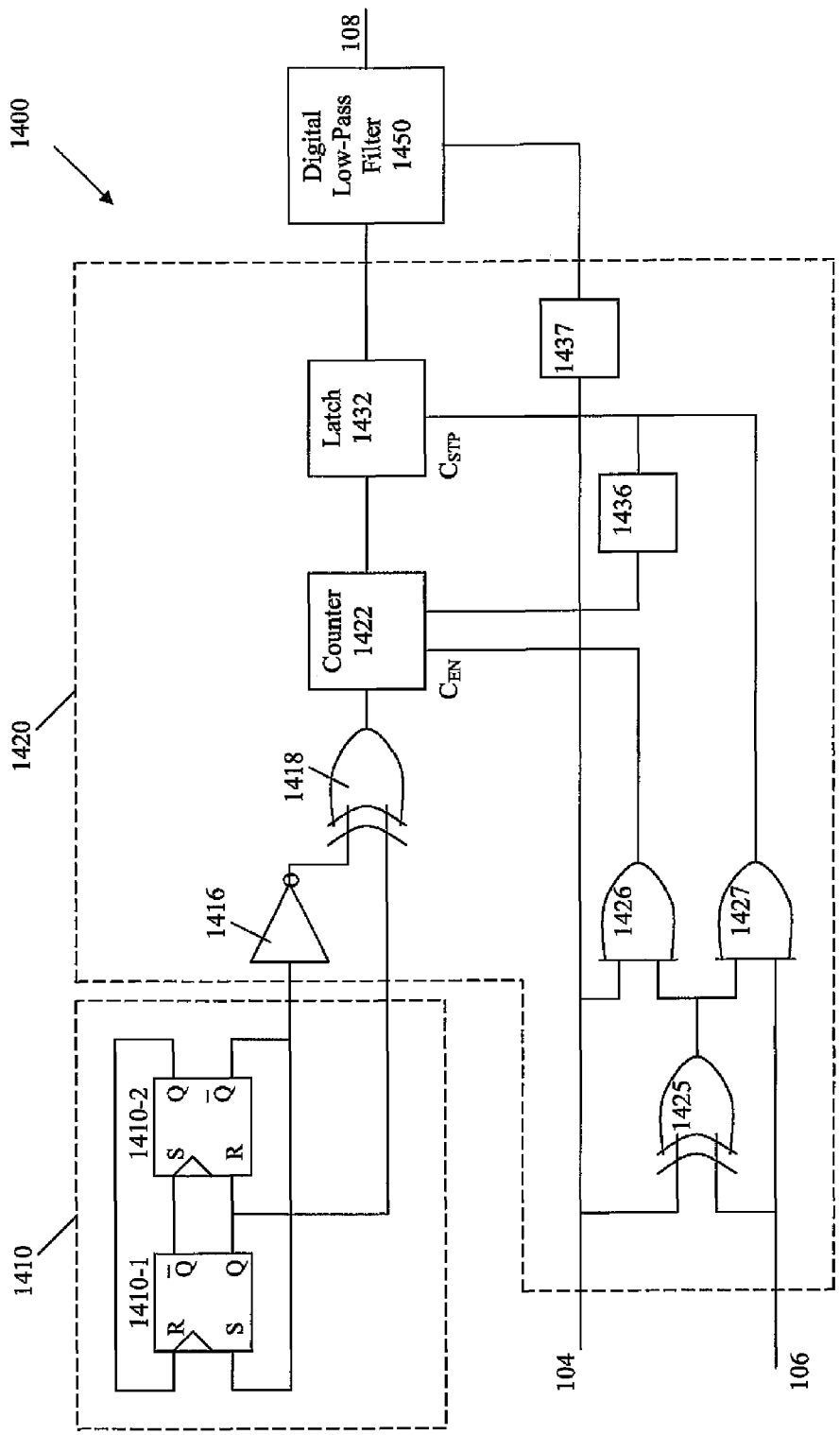
FIG. 14 is a block diagram illustrating a time-to-digital conversion system, according to another representative embodiment.

FIG. 14 is a block diagram showing an illustrative system for performing time-to-digital conversion to provide a digital representation of a time difference between a reference signal and an input signal, according to another representative embodiment.

Referring to FIG. 14, time-to-digital conversion system 1400 includes digital low-pass filter 1450, which is substantially the same as the digital low-pass filter 150 discussed above with reference to FIG. 1. In the depicted embodiment, the time-to-digital conversion system 1400 further includes free-running FSM 1410 and timing circuit 1420 as the FSM 110 and the timing circuit 120 in FIG. 1, respectively.

Similar to FSM 1310, discussed above, the FSM 1410 is implemented as a ring oscillator, including two cross-connected SR latches 1410-1 to 1410-2 to provide four phases. The SR latch 1410-2 has an S input connected to an inverted output $\overline{Q}$ of the SR latch 1410-1, and an R input connected to a non-inverted output Q of the SR latch 1410-1. Likewise, the SR latch 1410-1 has an S input connected to an inverted output $\overline{Q}$ of the SR latch 1410-2, and an R input connected to a non-inverted output Q of the SR latch 1410-2.

The timing circuit 1420 includes an inverter 1416 and XOR gate 1418 connected to the FSM 1410. In particular, the inverter 1416 has an input connected to the inverted output $\overline{Q}$ of the SR latch 1410-2, and the XOR gate 1418 has a first input connected to the non-inverted output Q of the SR latch 1410-1 and a second input connected to the inverter 1416. The output of the XOR gate 1418 is provided to a clock input of counter 1422, which is connected to latch 1432, in the timing circuit 1420.

The reference signal 104 and the input signal 106 are input to a logic circuit of the timing circuit 1420, including XOR gate 1425, first AND gate 1426 and second AND gate 1427. More particularly, the XOR gate 1425 receives the reference signal 104 and the input signal 106 as inputs, the AND gate 1426 receives the reference signal 104 and the output of the XOR gate 1425 as inputs, and the AND gate 1427 receives the input signal 106 and the output of the XOR gate 1425 as inputs.

The output of the first AND gate 1426 provide a count enable signal $C_{EN}$ to an enable input of the counter 1422, and the output of the second AND gate 1427 provides a count stop signal $C_{STP}$ to a load input of the latch 1432, respectively. The output of the second AND gate 1427 also provides the count stop signal $C_{STP}$ to a reset input of the counter 1422 through first delay element 1436. The reference signal 104 is provided to a clock input of the low-pass filter 1450 through second delay element 1437.

In the depicted configuration, the FSM 1410 is shown as having two states through which it transitions. The counter 1422 counts state transitions of the FSM 1410 that occur during each counting interval, where the counting interval corresponds to the time difference $\Delta t$ between the reference signal 104 and the input signal 106, as discussed above. Only one counter (counter 1422) is needed in the depicted configuration because the inverter 1416 and the XOR gate 1418 double the frequency of the FSM 1410, so counting just one edge (e.g., positive edges) provides the correct count. The beginning (start time $t_{start}$) of each counting interval is determined by the count enable signal $C_{EN}$ received by the counter 1422, and the end of each counting interval (stop time $t_{stop}$) is determined by the count stop signal $C_{STP}$, which causes the latches 1432 to latch the current count of the counter 1422 at the end of the counting interval. The count stop signal $C_{STP}$ also resets the counter 1422 to begin counting the number of state transitions of the FSM 1410 for the next counting interval.

Unlike the FSM 1310 in FIG. 13, the FSM 1410 provides a signal to the counter whose period is $\tau_d$ as a result of the inverter 1416 and the XOR gate 1418. Other means of doubling the FSM output frequency may be employed without departing from the scope of the present teachings. Therefore, the single counter 1422 and latch 1432 sample and latch the number of state transitions for each counting interval, which is directly to the digital low-pass filter 1450 (without the need for an adder). The digital low-pass filter 1450 produces weighted sums (averages) of the state transition counts output by the latch 1432 of the timing circuit 1420. As discussed above, the weighted sums are indicative of the ratio between the counting interval and the predetermined and essentially constant state dwell time $\tau_d$ of the FSM 1410. Also, the delayed reference signal 104 is provided to the digital low-pass filter 1450 as a delayed clock in order to allow the calculation of integer estimate M to occur prior to being processed by the digital low-pass filter 1450.

While specific embodiments are disclosed herein, many variations are possible, which remain within the concept and scope of the invention. Such variations would become clear after inspection of the specification, drawings and claims herein. The invention therefore is not to be restricted except within the scope of the appended claims.

What is claimed is:

1. An apparatus for providing a digital representation of a time difference between a reference signal having a reference signal period and an input signal having an input signal period, the apparatus comprising:
    a free-running finite state machine (FSM) configured to traverse a plurality of states in a predetermined order, the plurality of states having corresponding state vectors, each state vector being held for a state dwell time;
    a timing circuit configured to receive the reference signal, the input signal and the state vectors, and to determine state transition counts corresponding to a number of state transitions that occur during a counting interval at each reference signal period, wherein the counting interval corresponds to the time difference between the reference signal and the input signal; and
    a digital low-pass filter configured to receive the state transition counts corresponding to the reference signal periods, and to provide an output value comprising weighted sums of the state transition counts, the output value being proportional to the time difference between the reference signal and the input signal,
    wherein a period of the FSM is independent of the reference signal period.

2. The apparatus of claim 1, wherein the output value comprises an average state transition count when weighting coefficients of the digital low-pass filter are unity.

3. The apparatus of claim 1, wherein the state dwell time is determined by phase locking the FSM to a clock of known period.

4. The apparatus of claim 1, wherein the counting interval is defined by a start time corresponding to a predetermined level of the reference signal, and a stop time corresponding to a predetermined level of the input signal.

5. The apparatus of claim 4, wherein the timing circuit comprises:
    a first latch connected to the FSM and the reference signal, the first latch being configured to latch first state vectors of the FSM corresponding to the start time;
    a second latch connected to the FSM and the input signal, the second latch being configured to latch second state vectors of the FSM corresponding to the stop time;
    a first decoder configured to decode the first state vectors into first disambiguated values;
    a second decoder configured to decode the second state vectors into second disambiguated values; and
    a difference circuit configured to determine state transition counts corresponding to the number of state transitions occurring between the states represented by the first disambiguated values and the states represented by the second disambiguated values, respectively.

6. The apparatus of claim 5, wherein the timing circuit further comprises:
    a decimator circuit, comprising the digital low-pass filter and a down sampler, configured to provide an average state transition count at a rate lower than a rate of the reference signal.

7. The apparatus of claim 5, wherein the FSM comprises a ring oscillator.

8. The apparatus of claim 7, further comprising:
    a binary counter comprising a clock input connected to an output of the FSM, a reset input connected to the input signal, and an output connected to the first and second latches, the binary counter providing extended states in addition to the plurality of states of the FSM.

9. The apparatus of claim 8, wherein the clock of the binary counter is connected to a final stage of the FSM for clocking the binary counter.

10. The apparatus of claim 1, wherein the timing circuit comprises:
    a logic circuit configured to receive the reference signal and the input signal, and to output a count enable signal and a count stop signal defining each counting interval;
    at least one counter connected to the FSM and the logic circuit, and configured to begin counting state transitions in response to the count enable signal; and
    at least one latch connected to the at least one counter and the logic circuit, and configured to latch the number of state transitions counted by the counter during the counting interval in response to the count stop signal.

11. The apparatus of claim 10, wherein the FSM comprises a first SR latch cross-connected with a second SR latch, and wherein the timing circuit further comprises:
- an inverter connected to an inverting output of the second SR latch; and
- an exclusive OR (XOR) gate connected to a non-inverting output of the first SR latch and an output of the inverter, the at least one counter being connected to an output of the XOR gate.

12. The apparatus of claim 10, wherein the FSM comprises:
- a first SR latch cross-connected with a second SR latch, wherein the at least one counter of the timing circuit comprises a first counter connected to a non-inverting output of the first SR latch, and a second counter connected to a non-inverting output of the second SR latch, and
- wherein the at least one latch of the timing circuit comprises a first latch connected to the first counter and a second latch connected to the second counter.

13. The apparatus of claim 12, wherein the timing circuit further comprises:
- an adder circuit configured to add the latched number of state transitions from the first and second latches.

14. The apparatus of claim 10, wherein the timing circuit further comprises:
- a first comparator configured to convert the reference signal from a sine wave to a square wave by comparing the reference signal to a first reference voltage; and
- a second comparator configured to convert the input signal from a sine wave to a square wave by comparing the input signal to a second reference voltage.

15. A method for determining a digital representation of a time difference between a reference signal having a reference signal period and an input signal having an input signal period, the method comprising:
- receiving the reference signal and the input signal;
- receiving state vectors corresponding to a plurality of states periodically traversed by a continuously free-running finite state machine (FSM) in a predetermined order, each state vector being held for a state dwell time occurring between state transitions;
- determining a plurality of state transition counts corresponding to a plurality of counting intervals, the state transition counts being numbers of state transitions occurring in the FSM during the corresponding counting intervals, wherein each counting interval corresponds to the time difference between the reference signal and the input signal for each corresponding reference signal period;
- producing weighted sums of the numbers of the state transitions, each weighted sum being indicative of a ratio between the corresponding counting interval and the state dwell time; and
- outputting an output signal estimating the time difference between the reference signal and the input signal based on the ratio between the corresponding counting interval and the state dwell time,
- wherein a period of the FSM is independent of the reference signal period.

16. The method of claim 15, further comprising:
- down-sampling the output weighted sums of the state transition counts to a rate less than a reference clock frequency corresponding to the reference signal period.

17. An all digital phase lock loop (ADPLL), comprising:
- a time-to-digital converter (TDC) configured to provide a digital time difference signal representing a time difference between a reference signal and an input signal based on an analog output signal of the ADPLL, the reference signal having a reference signal period and the input signal having an input signal period; and
- a controllable oscillator configured to provide the analog output signal, the analog output signal having a frequency controlled by the digital time difference signal, wherein the TDC comprises:
  - a free-running finite state machine (FSM) configured to traverse a plurality of states in a predetermined order, the plurality of states having corresponding state vectors, each state vector being held for a state dwell time;
  - a timing circuit configured to receive the reference signal, the input signal and the state vectors, and to determine state transition counts equal to a number of state transitions that occur during a counting interval at each reference signal period, wherein the counting interval corresponds to the time difference between the reference signal and the input signal; and
  - a digital low-pass filter configured to receive the state transition counts corresponding to the reference signal periods, and to provide an output value comprising weighted sums of the state transition counts, the output value being proportional to the time difference between the reference signal and the input signal, wherein a period of the FSM is independent of the reference signal period.

18. The ADPLL of claim 17, wherein the controllable oscillator comprises a digitally controlled oscillator (DCO).

19. The ADPLL of claim 17, wherein the controllable oscillator comprises a voltage controlled oscillator (VCO).

20. The ADPLL of claim 19, further comprising:
- a digital-to-analog converter (DAC) configured to convert the digital time difference signal to an analog frequency control signal, the VCO providing the analog output signal based on the analog frequency control signal from the DAC.

\* \* \* \* \*